United States Patent
Hirakawa

(10) Patent No.: US 12,083,624 B2
(45) Date of Patent: Sep. 10, 2024

(54) METHOD OF PRINTING LASER MARK AND METHOD OF PRODUCING LASER-MARKED SILICON WAFER

(71) Applicant: SUMCO CORPORATION, Tokyo (JP)

(72) Inventor: Yoichiro Hirakawa, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 0 days.

(21) Appl. No.: 17/633,035

(22) PCT Filed: Jul. 6, 2020

(86) PCT No.: PCT/JP2020/026461
§ 371 (c)(1),
(2) Date: Feb. 4, 2022

(87) PCT Pub. No.: WO2021/024674
PCT Pub. Date: Feb. 11, 2021

(65) Prior Publication Data
US 2022/0331906 A1 Oct. 20, 2022

(30) Foreign Application Priority Data

Aug. 7, 2019 (JP) ................................. 2019-145410

(51) Int. Cl.
*H01L 21/302* (2006.01)
*B23K 26/0622* (2014.01)
(Continued)

(52) U.S. Cl.
CPC ...... *B23K 26/3576* (2018.08); *B23K 26/0622* (2015.10); *B23K 26/18* (2013.01);
(Continued)

(58) Field of Classification Search
CPC ........... B23K 26/3576; B23K 26/0622; B23K 26/18; B23K 2101/007; B23K 2101/40;
(Continued)

(56) References Cited

U.S. PATENT DOCUMENTS 6,037,259 A * 3/2000 Lin .................... H01L 21/67282
438/959
6,962,860 B2 11/2005 Yamazaki et al.
(Continued)

FOREIGN PATENT DOCUMENTS

CN 108682647 10/2018
CN 110255492 A * 9/2019
(Continued)

OTHER PUBLICATIONS

Tashi D Sherpa et al, Micro-grooving of silicon wafer by Nd:YAG laser beam machining, 2018, International Conference on Mechanical, Materials and Renewable Energy, vol. 377, 012219-1-012219-6 (Year: 2018).*
(Continued)

*Primary Examiner* — Samuel Park
(74) *Attorney, Agent, or Firm* — Greenblum & Bernstein, P.L.C.

(57) ABSTRACT

Provided is a laser mark printing method and a method of producing a laser-marked silicon wafer that can reduce the machining strain left around dots constituting a laser mark. In a method of printing a laser mark having a plurality of dots on a silicon wafer, the plurality of dots is formed using laser light having a wavelength in the ultraviolet region.

4 Claims, 3 Drawing Sheets

(51) Int. Cl.
  *B23K 26/18* (2006.01)
  *B23K 26/352* (2014.01)
  *H01L 21/02* (2006.01)
  *B23K 101/00* (2006.01)
  *B23K 101/40* (2006.01)
  *H01L 23/544* (2006.01)

(52) U.S. Cl.
  CPC .. *H01L 21/02013* (2013.01); *H01L 21/02016* (2013.01); *H01L 21/02019* (2013.01); *B23K 2101/007* (2018.08); *B23K 2101/40* (2018.08); *H01L 23/544* (2013.01); *H01L 2223/5442* (2013.01); *H01L 2223/54433* (2013.01); *H01L 2223/54493* (2013.01)

(58) Field of Classification Search
  CPC .... B23K 2103/56; B23K 26/36; B23K 26/70; B23K 26/00; B23K 26/362; B23K 26/0084; B23K 26/0624; B23K 26/0676; B23K 26/40; B23K 26/355; B23K 26/361; H01L 21/02013; H01L 21/02016; H01L 21/02019; H01L 23/544; H01L 2223/5442; H01L 2223/54433; H01L 2223/54453; H01L 2223/54493; H01L 2223/54406; H01L 21/02; H01L 21/304; H01L 21/02021; H01L 21/02024; H01L 2924/0002; H01L 2924/00; C30B 29/06; B41M 5/24; G06K 1/126; H05K 1/0266; H05K 3/0026; B33Y 80/00
  USPC ...... 257/77, 21.028, 21.214, 21.228, 21.245, 257/21.596; 347/101, 148, 216, 238, 347/430; 438/662, 691, 692, 713, 735, 438/787, 795, 940, 959
  See application file for complete search history.

(56) References Cited

U.S. PATENT DOCUMENTS

| | | | | |
|---|---|---|---|---|
| 7,416,962 | B2 * | 8/2008 | Harrison | H01L 21/02024 257/E21.228 |
| 2002/0093562 | A1 * | 7/2002 | Katayama | B41M 5/262 347/238 |
| 2002/0149136 | A1 * | 10/2002 | Baird | B23K 26/364 219/121.67 |
| 2003/0102292 | A1 * | 6/2003 | Han | H01L 21/681 438/795 |
| 2006/0000814 | A1 * | 1/2006 | Gu | B41M 5/24 219/121.68 |
| 2007/0207570 | A1 | 9/2007 | Choi et al. | |
| 2008/0073438 | A1 * | 3/2008 | Gu | B23K 26/40 235/494 |
| 2011/0021025 | A1 * | 1/2011 | Hashii | H01L 23/544 438/691 |
| 2012/0223335 | A1 * | 9/2012 | Tsuchiya | H01L 23/544 257/77 |
| 2013/0109200 | A1 * | 5/2013 | Miyazaki | H01L 21/268 438/787 |
| 2016/0102009 | A1 * | 4/2016 | Boek | B23K 26/384 65/65 |
| 2017/0236954 | A1 * | 8/2017 | Kramer | H01L 31/022425 136/256 |

FOREIGN PATENT DOCUMENTS

| | | | | |
|---|---|---|---|---|
| JP | 11-000772 | | 1/1999 | |
| JP | 2000-263840 | | 9/2000 | |
| JP | 2000-286173 | | 10/2000 | |
| JP | 2001219386 A | * | 8/2001 | ............ B23K 26/00 |
| JP | 2003-188059 | | 7/2003 | |
| JP | 2008-504964 | | 2/2008 | |
| JP | 2011-029355 | | 2/2011 | |
| JP | 2011029355 A | * | 2/2011 | ....... H01L 21/02024 |
| JP | 2011187706 A | * | 9/2011 | |
| JP | 2013-093493 | | 5/2013 | |
| JP | 2014-036134 | | 2/2014 | |
| JP | 2020068231 A | * | 4/2020 | ....... H01L 21/02008 |
| TW | 201418875 A | * | 5/2014 | ............ B82Y 10/00 |

OTHER PUBLICATIONS

International Search Report issued in PCT/JP2020/026461, Sep. 24, 2020, English translation.
Office Action issued in TW Patent Appl. No. 109122878, Mar. 24, 2021, English translation.
Office Action issued in TW Patent Appl. No. 109122878, Apr. 8, 2021, English translation.
Office Action issued in TW Patent Appl. No. 109122878, Dec. 28, 2021, English translation.
International Preliminary Report on Patentability in PCT/JP2020/026461, Feb. 8, 2022, English translation.
Office Action issued in Japanese Patent Application No. 2019-145410, Jul. 26, 2022, English translation.
Office Action issued in family member Korean Patent Application No. 10-2022-7003675, Jan. 8, 2024, and English translation thereof.

* cited by examiner

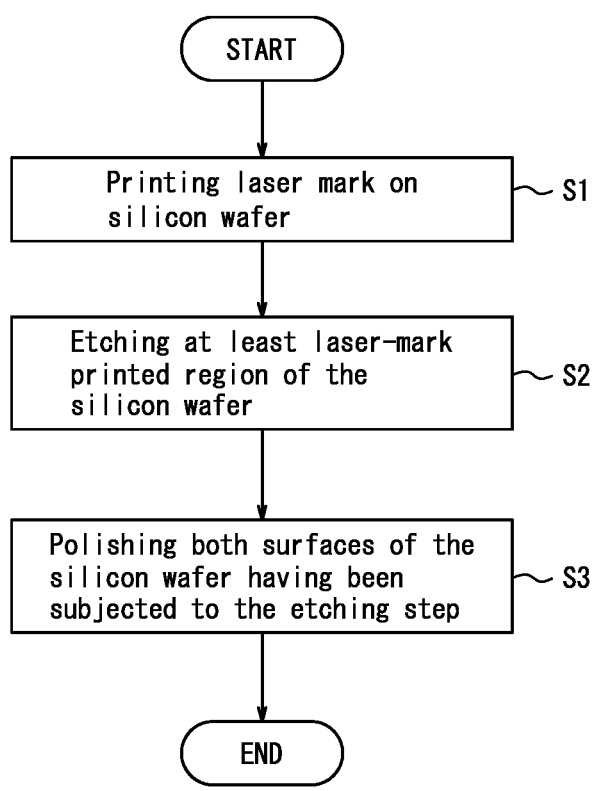

FIG. 2

| Wavelength (nm) | Number of pulse per second | | Amount removed by etching per side | | |
|---|---|---|---|---|---|
| | | | 1.5 μm | 12.5 μm | 50.0 μm |
| 1064 | 15000 | Measurement image | Comparative Example 1 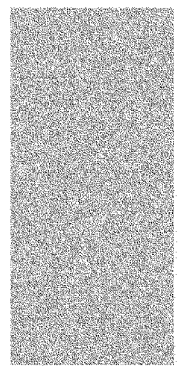 | Comparative Example 2 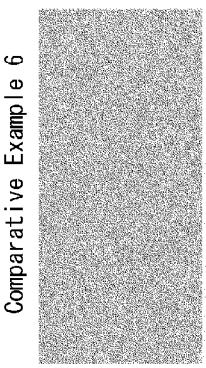 | Comparative Example 3 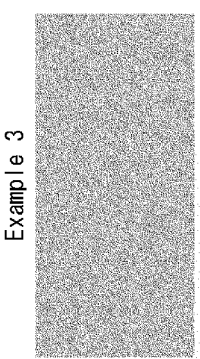 |
| | | Number of dots with strain | 76/82 | 73/82 | 0/82 |
| 532 | 15000 | Measurement image | Comparative Example 4 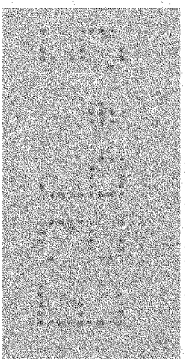 | Comparative Example 5 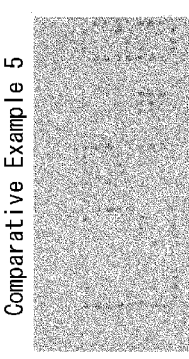 | Comparative Example 6 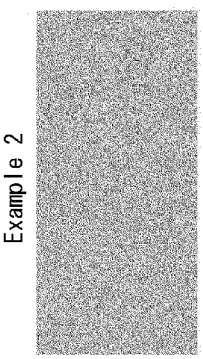 |
| | | Number of dots with strain | 84/87 | 70/87 | 0/87 |
| 355 | 15000 | Measurement image | Example 1 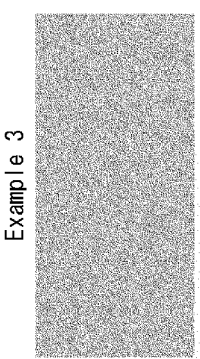 | Example 2 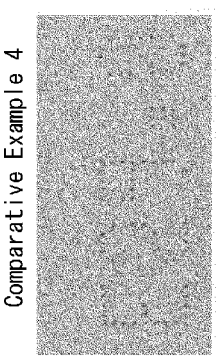 | Example 3 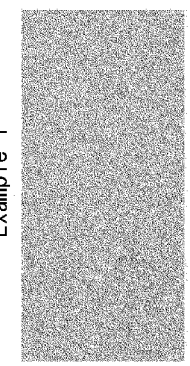 |
| | | Number of dots with strain | 0/83 | 0/83 | 0/83 |

FIG. 3
| Wavelength: 355 nm Number of pulse per second | | Amount removed by etching per side | |
|---|---|---|---|
| | | 1.5 μm | 12.5 μm |
| 10000 | Measurement image | Example 4 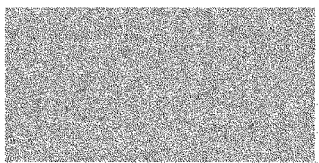 | Example 5 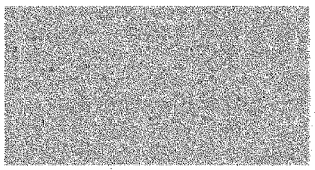 |
| | Number of dots with strain | 13/83 | 16/83 |
| 15000 | Measurement image | Example 1 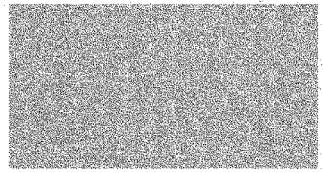 | Example 2 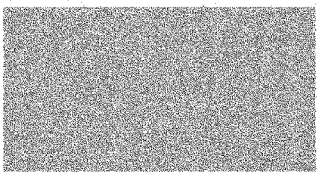 |
| | Number of dots with strain | 0/83 | 0/83 |
| 20000 | Measurement image | Example 6 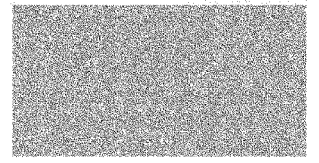 | Example 7 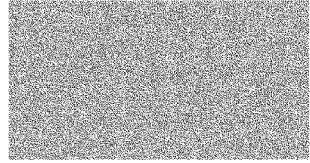 |
| | Number of dots with strain | 0/83 | 0/83 |
| 25000 | Measurement image | Example 8 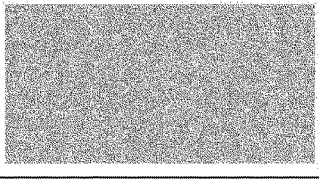 | Example 9 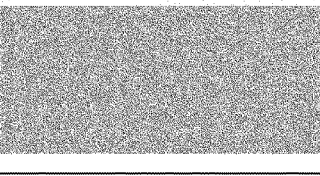 |
| | Number of dots with strain | 0/83 | 0/83 |

METHOD OF PRINTING LASER MARK AND METHOD OF PRODUCING LASER-MARKED SILICON WAFER

TECHNICAL FIELD

This disclosure relates to a method of printing laser marks and a method of producing a laser-marked silicon wafer.

BACKGROUND

Conventionally, silicon wafers are widely used as substrates for semiconductor devices. Such silicon wafers are produced in the following manner. First, a single crystal silicon ingot grown, for example, by the Czochralski (CZ) process is cut into blocks. The periphery of each block is ground and the block is then sliced.

Next, each of silicon wafers obtained by the slicing is subjected to beveling and one or more of processes such as lapping, surface grinding, and double-disc grinding as appropriate. The periphery of the front surface or the back surface of the silicon wafer having been subjected to the above processes may be printed with an identification code (mark) for management or identification of wafers by irradiation with laser light. The mark printed using laser light (hereinafter referred to as "laser mark") is constituted by characters and symbols each depicted with a set of a plurality of recesses (dots) and is of a size such that it can be identified visually or using a camera or the like. Conventionally, the laser light used has a wavelength in the infrared region (for example, see JP H11-000772 (PTL 1)).

The irradiation with the above laser light forms a ring-shaped raised area around each dot. Accordingly, at least a laser-mark printed region of the silicon wafer printed with the laser mark (hereinafter also referred to as "laser mark region") is subjected to etching to remove the above raised area, followed by polishing on the surface of the silicon wafer (for example, see JP 2011-029355 A (PTL 2)). The polished silicon wafer is subjected to final cleaning. Further, the silicon wafers are subjected to a variety of inspections and ones that meet predetermined quality standards are shipped as products.

CITATION LIST

Patent Literature

PTL 1: JP H11-000772 A
PTL 2: JP 2011-029355 A

SUMMARY

Technical Problem

In recent years, as semiconductor devices are increasingly miniaturized and integrated, the silicon wafers are required to be very flat. Further, device formation regions are also increasingly expanded in the radially outward direction of wafers year by year, so the wafer peripheries are also required to have high flatness.

As described above, the raised area formed around each dot is removed by etching. However, a study made by the inventor of this disclosure has demonstrated that although the raised area is removed as described above, machining strain around the dot, caused by the thermal effect of laser irradiation remains without being completely removed. If a silicon wafer with such machining strain being left is subjected to polishing, the wafer surface would not be uniformly polished and the flatness of the wafer periphery would be reduced.

Considering the above problem, it could be helpful to provide a laser mark printing method and a method of producing a laser-marked silicon wafer that can reduce the machining strain left around dots constituting a laser mark.

Solution to Problem

We propose the following features to solve the above problem.

[1] A method of printing a laser mark having a plurality of dots on a silicon wafer, comprising forming each of the plurality of dots using laser light having a wavelength in an ultraviolet region.

[2] The method of printing a laser mark, according to [1] above, wherein each of the plurality of dots is formed by performing irradiation with laser light a plurality of times.

[3] The method of printing a laser mark, according to [2] above, wherein a number of pulses in the plurality of times of irradiation with laser light is 15000 or more per second.

[4] A method of producing a laser-marked silicon wafer, comprising:
a laser mark printing step of printing a laser mark by the method of printing a laser mark, according to any one of [1] to [3] above, on a silicon wafer that is obtained by slicing a single crystal silicon ingot grown by a predetermined method and is subjected to beveling;
an etching step of performing etching on at least a laser-mark printed region of the silicon wafer; and
a polishing step of performing polishing on both surfaces of the silicon wafer having been subjected to the etching step.

[5] The method of producing a laser-marked silicon wafer, according to [4] above, wherein an amount removed by etching in the etching step is 1.5 µm or more per side.

[6] The method of producing a laser-marked silicon wafer, according to [4] or [5] above, wherein an etchant used in the etching step is one of an acidic etchant and an alkaline etchant.

Advantageous Effect

This disclosure can reduce the machining strain left around dots constituting a laser mark.

BRIEF DESCRIPTION OF THE DRAWINGS

FIG. 1 is a flowchart of a method of producing a laser-marked silicon wafer, according to this disclosure;

FIG. 2 is a diagram illustrating the relationship between the wavelength of laser light and the amount removed by etching, and the machining strain left round dots; and FIG. 3 is a diagram illustrating the relationship between the number of pulses per second in laser irradiation and the machining strain left around dots.

DETAILED DESCRIPTION (Laser Mark Printing Method)

Embodiments of this disclosure will now be described with reference to the drawings. The laser mark printing method according to this disclosure is a method of printing a laser mark having a plurality of dots on a silicon wafer. The plurality of dots here are each formed using laser light having a wavelength in the ultraviolet region.

As described above, a study made by the inventor has demonstrated that although the raised area formed by laser irradiation is removed by etching, the machining strain around dots remains without being completely removed, and the flatness of the wafer periphery is reduced by subsequent polishing.

The inventor has intensively studied ways to reduce the above machining strain. As will be described in Examples below, significantly increasing the amount removed by etching (for example, 50 µm) can completely remove the machining strain around dots. However, in the current wafer production process, the amount removed by etching is approximately several micrometers, so that the above measure is not desirable in terms of production cost.

As such, the inventor diligently studied ways to reduce the machining strain around dots without significantly increasing the amount removed by etching as described above. As a result, the inventor conceived of forming each of the plurality of dots constituting a laser mark using laser light having a wavelength in the ultraviolet region.

Specifically, in conventional methods as one in PTL 1, laser light having a wavelength in the infrared region is typically used for the formation of dots constituting a laser mark. The inventor studied the relationship between the machining strain around dots and the wavelength of laser light. As a result, as described in Examples below, the machining strain was found to be reduced by reducing the wavelength of the laser light. In particular, the machining strain around dots was found to be significantly reduced using laser light having a wavelength in the ultraviolet region, and this finding led to this disclosure. The following description will discuss each feature of this disclosure.

A silicon wafer to be printed with a laser mark may use one obtained by performing known wafer edge grinding, slicing, and beveling and one or more processes such as lapping, surface grinding, and double-disc grinding as appropriate on a single crystal silicon ingot grown by the CZ process or the floating zone (FZ) process.

In the growth of the single crystal silicon ingot, the oxygen concentration, the carbon concentration, the nitrogen concentration, and the like can be suitably adjusted so that the silicon wafer cut out of the grown silicon ingot will have the desired characteristics. Further, suitable dopants may be added to obtain a wafer having a conductivity type of n-type or p-type.

The diameter of the silicon wafer may be, for example, 200 mm, or may be 300 mm or more (for example, 300 mm or 450 mm). Further, the thickness of the silicon wafer may be an appropriate thickness depending on the specifications (for example, 700 µm to 1 mm).

As described above, it is important that each of the plurality of dots constituting a laser mark is formed using laser light having a wavelength in the ultraviolet region in this disclosure. This can reduce machining strain around dots by reducing the thermal effect due to the laser irradiation. Note that "a wavelength in the ultraviolet region" herein means a wavelength of 355 nm or less.

A laser light source used may be, for example, an argon laser, an excimer laser, or a YAG laser. Of these, a YAG laser typically used as a light source for laser marking is preferably used.

The depth of each dot formed by a single irradiation with laser light does not depend on the output power of the laser light, and is for example approximately 2 µm to 10 µm although depending on the apparatus used. Accordingly, when a dot having a desired depth cannot be formed by a single irradiation with laser light, the dot may be formed by a plurality of times of irradiation with laser light.

In this case, the number of pulses in the plurality of times of irradiation with laser light is preferably 10000 or more per second, more preferably 15000 or more per second. With the number of pulses in the plurality of times of irradiation with laser light being set to 10000 or more per second, the energy per a single pulse irradiation is reduced, thus the machining strain around the dot can be reduced more. Further, with the number of pulses in the laser irradiation being set to 15000 or more per second, the machining strain around the dot can be removed almost completely.

The silicon wafer printed with a laser mark as described above is then subjected to an etching step and a polishing step. In the etching step, the raised areas formed around the laser mark are removed. Since the machining strain left around dots is reduced as compared with the case of using a conventional method, the silicon wafer periphery can have improved flatness after the polishing step.

(Method of Producing Laser-Marked Silicon Wafer)

A method of producing a laser-marked silicon wafer, according to this disclosure will now be described. FIG. 1 presents a flowchart of a method of producing a laser-marked silicon wafer, according to this disclosure. As illustrated in this diagram, this disclosure involves a laser mark printing step of printing a laser mark by the above-described method of printing a laser mark, according to this disclosure, on a silicon wafer that is obtained by slicing a single crystal silicon ingot grown by a predetermined method such as the CZ process or the FZ process and is subjected to beveling (Step S1); an etching step of performing etching on at least a laser-mark printed region of the silicon wafer (Step S2); and a polishing step of performing polishing on both surfaces of the silicon wafer having been subjected to the etching step (Step S3).

First, the laser mark printing step of Step S1 is the same as the step performed by the above-mentioned laser mark printing method, according to this disclosure, so the description will not be repeated. With respect to this step, the machining strain left around dots can be reduced by forming each of the plurality of dots using laser light having a wavelength in the ultraviolet region.

After the above laser mark printing step, etching is performed on at least a laser-mark printed region of the silicon wafer in Step S2 (etching step). This etching step removes the raised area formed around each dot by the laser irradiation in Step S1 and can also eliminate warpage of the silicon wafer caused by lapping.

The above etching step can be performed for example by immersing and keeping the silicon wafer printed with the laser mark in an etchant filling an etching tank while rotating the wafer.

The etchant used may be an acidic or alkaline etchant, and an alkaline etchant is preferably used. As an acidic etchant, an etchant of nitric acid or hydrofluoric acid can be used. Meanwhile, as an alkaline etchant, an etchant that is an aqueous solution of sodium hydroxide or potassium hydroxide is preferably used. This etching step removes the raised area around each dot constituting the laser mark and can also eliminate warpage of the silicon wafer caused by lapping.

The amount removed by the above etching process is preferably 0.5 µm or more per side, more preferably 1.5 µm or more per side. As will be described in Examples below, when the amount removed by the etching process is 1.5 µm per side, the machining strain can be removed almost completely.

On the other hand, the upper limit of the amount removed by etching is not specified in terms of removing the above machining strain around the dots and removing warpage caused due to lapping, yet is preferably 15 μm or less in terms of production cost.

After the above etching step, in Step S3, polishing is performed on the surfaces of the silicon wafer having been subjected to the etching step (polishing step). In this polishing step, both surfaces of the wafer having been subjected to etching are polished using a polishing slurry containing abrasive grains.

In this polishing step, mirror-polishing is performed on both surfaces of the silicon wafer by setting the silicon wafer in a carrier; holding the wafer between an upper plate and a lower plate to each of which a polishing cloth is attached; flowing a slurry, for example, colloidal silica, into the space between the upper and lower plates and the wafer; and rotating the upper and lower plates relative to the carrier plate. Thus, irregularities on the surfaces of the wafer can be reduced, so that a highly flat wafer can be obtained.

Specifically, an alkaline slurry containing colloidal silica as abrasive grains can be used as the polishing slurry.

After the above polishing step, one-side finish polishing in which at least one of the surfaces of the silicon wafer is finish-polished one by one is performed. The finish polishing includes both polishing of only one surface and polishing of both surfaces. When both surfaces are polished, one surface is polished first and the other surface is then polished.

Subsequently, after the finish polishing, the silicon wafer having been subjected to polishing is cleaned. Specifically, particles, organic matter, metal, etc. on the wafer surfaces are removed using, for example, an SC-1 cleaning solution that is a mixture of aqueous ammonia, a hydrogen peroxide solution, and water, or an SC-2 cleaning solution that is a mixture of hydrochloric acid, a hydrogen peroxide solution, and water.

Finally, the flatness of the cleaned silicon wafer, the number of LPDs in the wafer surface, damage, contamination of the wafer surface, etc. are examined. Only silicon wafers which meet predetermined quality requirements in those examinations are shipped as products.

As such, the machining strain around the dots constituting the laser mark can be reduced, thus a laser-marked silicon wafer with high flatness of the periphery can be produced.

EXAMPLES

Examples of this disclosure will now be described; however, this disclosure is not limited to the Examples.
<Relationship Between Machining Strain Around Dots and Wavelength of Laser Light>

Examples 1 to 3

A laser-marked silicon wafer according to this disclosure was prepared in accordance with to the flowchart given in FIG. 1. First, a laser mark was printed on a peripheral portion of a silicon wafer (laser mark printing step). Specifically, a single crystal silicon ingot with a diameter of 300 mm, grown by the CZ process was cut into blocks, and one of the blocks was subjected to wafer edge grinding and was then sliced. The silicon wafer obtained was subjected to beveling and lapping, and the laser mark constituted by a plurality of dots having a depth of 55 μm was then printed on the periphery of the back surface of the silicon wafer. For the laser mark printing, laser light having a wavelength (355 nm) in the ultraviolet region was used. Further, the dots were formed by 18 times of irradiation with laser light, and the number of pulses in the laser irradiation was 15000 per second.

The silicon wafer having been printed with the laser mark on the periphery of the back surface as described above was subjected to etching (etching step). Specifically, a potassium hydroxide aqueous solution was used as an etchant, and the amount removed by etching was set to 1.5 μm (Example 1), 12.5 μm (Example 2), and 50 μm (Example 3) per side.

After that, the silicon wafer having been subjected to etching was subjected to double-side polishing (polishing step). Specifically, first, the silicon wafer having been subjected to etching was set in a carrier, and the wafer was held between an upper plate and a lower plate to each of which a polishing cloth was attached. Mirror-polishing was then performed on both surfaces of the silicon wafer by flowing an alkaline polishing slurry containing colloidal silica into the space between the upper and lower plates and the wafer and rotating the upper and lower plates and the carrier plate in opposite directions. The amount removed by the double-side polishing was approximately 5.0 μm per side.

Subsequently, after performing finish polishing on the silicon wafer having been subjected to the above polishing, cleaning was performed, thus a laser-marked silicon wafer according to this disclosure was obtained. The laser-marked area of the laser-marked silicon wafer obtained was subjected to the measurement of the machining strain around the dots using an XRT system manufactured by Rigaku Corporation. An XRT image obtained is given in FIG. 2.

Comparative Example 1

As in Example 1, a laser-marked silicon wafer was prepared. Note however that the laser light used in printing a laser mark had a wavelength in the infrared region (wavelength: 1064 nm). All the other conditions were the same as those in Example 1. An XRT image obtained is given in FIG. 2.

Comparative Example 2

As in Example 2, a laser-marked silicon wafer was prepared. Note however that the laser light used in printing a laser mark had a wavelength in the infrared region (wavelength: 1064 nm). All the other conditions were the same as those in Example 2. An XRT image obtained is given in FIG. 2.

Comparative Example 3

As in Example 3, a laser-marked silicon wafer was prepared. Note however that the laser light used in printing a laser mark had a wavelength in the infrared region (wavelength: 1064 nm). All the other conditions were the same as those in Example 3. An XRT image obtained is given in FIG. 2.

Comparative Example 4

As in Example 1, a laser-marked silicon wafer was prepared. Note however that the laser light used in printing a laser mark had a wavelength in the visible region (wavelength: 532 nm). All the other conditions were the same as those in Example 1. An XRT image obtained is given in FIG. 2.

Comparative Example 5

As in Example 2, a laser-marked silicon wafer was prepared. Note however that the laser light used in printing a laser mark had a wavelength in the visible region (wavelength: 532 nm). All the other conditions were the same as those in Example 2. An XRT image obtained is given in FIG. 2.

Comparative Example 6

As in Example 3, a laser-marked silicon wafer was prepared. Note however that the laser light used in printing a laser mark had a wavelength in the visible region (wavelength: 532 nm). All the other conditions were the same as those in Example 3. An XRT image obtained is given in FIG. 2.

FIG. 2 illustrates the relationship between the wavelength of laser light and the amount removed by etching, and the machining strain left round the dots; the dots around which the machining strain remained are depicted, whereas the dots around which no machining strain remained are not depicted. Further, the ratio of the number of dots around which the machining strain remained with respect to the total number of the dots is given below each image.

FIG. 2 demonstrates that when the amount removed by etching was 1.5 μm and 12.5 μm per side and the wavelength of the laser light was 1064 nm and 532 nm (Comparative Examples 1, 2, 4, and 5), the machining strain remained around many dots. On the other hand, FIG. 2 demonstrates that when the wavelength of the laser light was 355 nm, the machining strain was removed around all the dots. Note that although the machining strain around all the dots was removed with all the wavelengths of laser light when the etching level was 50 μm per side, since the amount removed by etching in the current wafer production process is approximately several micrometers, the amount of 50 μm to be removed is not desirable in terms of cost.

<Relationship Between Number of Pulses in Laser Irradiation and Machining Strain Left Around Dots>

Example 4

As in Example 1, a laser-marked silicon wafer was prepared. Note however that the number of pulses in the laser irradiation for forming the plurality of dots was set to 10000. All the other conditions were the same as those in Example 1. An XRT image obtained is given in FIG. 3.

Example 5

As in Example 2, a laser-marked silicon wafer was prepared. Note however that the number of pulses in the laser irradiation for forming the plurality of dots was set to 10000. All the other conditions were the same as those in Example 2. An XRT image obtained is given in FIG. 3.

Example 6

As in Example 1, a laser-marked silicon wafer was prepared. Note however that the number of pulses in the laser irradiation for forming the plurality of dots was set to 20000. All the other conditions were the same as those in Example 1. An XRT image obtained is given in FIG. 3.

Example 7

As in Example 2, a laser-marked silicon wafer was prepared. Note however that the number of pulses in the laser irradiation for forming the plurality of dots was set to 20000. All the other conditions were the same as those in Example 2. An XRT image obtained is given in FIG. 3.

Example 8

As in Example 1, a laser-marked silicon wafer was prepared. Note however that the number of pulses in the laser irradiation for forming the plurality of dots was set to 25000. All the other conditions were the same as those in Example 1. An XRT image obtained is given in FIG. 3.

Example 9

As in Example 2, a laser-marked silicon wafer was prepared. Note however that the number of pulses in the laser irradiation for forming the plurality of dots was set to 25000. All the other conditions were the same as those in Example 2. An XRT image obtained is given in FIG. 3.

FIG. 3 illustrates the relationship between the number of pulses per second in the laser irradiation and the machining strain left around the dots. FIG. 3 also includes the XRT images of Example 1 and Example 2 given in FIG. 2. FIG. 3 demonstrates that when the number of pulses per second was 10000, the machining strain around many dots was removed, yet machining strain was left around some dots. On the other hand, when the number of pulses per second in the laser irradiation was 15000, 20000, and 25000, the machining strain around all the dots were found to have been removed.

INDUSTRIAL APPLICABILITY

This disclosure makes it possible to reduce the machining strain left around dots constituting a laser mark, and thus is useful in the semiconductor wafer production industry.

The invention claimed is:

1. A method of producing a laser-marked silicon wafer, comprising:
   printing a laser mark having a plurality of dots on a silicon wafer that is obtained by slicing a single crystal silicon ingot grown by a predetermined method and is subjected to beveling;
   performing etching on at least a laser-mark printed region of the silicon wafer; and
   performing polishing on both surfaces of the silicon wafer having been subjected to the etching, wherein
   each of the plurality of dots is formed by using a laser light having a wavelength in an ultraviolet region,
   each of the plurality of dots is formed by performing an irradiation with the laser light a plurality of times,
   a number of pulses in each of the plurality of times of the irradiation with the laser light is 15,000 or more per second, and
   an amount removed by etching is 0.5 μm or more and 1.5 μm or less per side.

2. The method of producing the laser-marked silicon wafer, according to claim 1, wherein an etchant used in the etching is one of an acidic etchant and an alkaline etchant.

3. The method of producing the laser-marked silicon wafer, according to claim 1, wherein machining strain is almost completely removed around the dots.

4. The method of producing the laser-marked silicon wafer, according to claim 2, wherein machining strain is almost completely removed around the dots.

* * * * *